(12) United States Patent
Chaskell

(10) Patent No.: US 6,233,312 B1
(45) Date of Patent: May 15, 2001

(54) INTER-CIRCUIT LINE FAULT LOCATION IN TELECOMMUNICATION NETWORKS

(75) Inventor: Andrew D Chaskell, Ipswich (GB)

(73) Assignee: British Telecommunications public limited company, London (GB)

( * ) Notice: Subject to any disclaimer, the term of this patent is extended or adjusted under 35 U.S.C. 154(b) by 0 days.

(21) Appl. No.: 09/125,719

(22) PCT Filed: Jul. 28, 1998

(86) PCT No.: PCT/GB98/02251

§ 371 Date: Aug. 25, 1998

§ 102(e) Date: Aug. 25, 1998

(87) PCT Pub. No.: WO99/07129

PCT Pub. Date: Feb. 11, 1999

(30) Foreign Application Priority Data

Jul. 31, 1997 (EP) .................................................. 97305799

(51) Int. Cl.[7] .............................. H04M 1/24; H04M 3/08; H04M 3/22
(52) U.S. Cl. .................................. 379/26; 379/22; 379/27; 379/31
(58) Field of Search .................................. 379/22, 26, 27, 379/31, 1, 2, 5, 16

(56) References Cited

U.S. PATENT DOCUMENTS

| 4,658,395 | * | 4/1987 | Blackburn ............................. 379/26 |
| 5,392,328 | * | 2/1995 | Schmidt et al. ...................... 379/10 |
| 5,557,651 | | 9/1996 | Wissman .............................. 379/6 |
| 5,699,402 | * | 12/1997 | Bauer et al. ......................... 379/26 |
| 5,802,143 | * | 9/1998 | Borchering et al. ................. 379/32 |
| 5,835,566 | * | 11/1998 | Cowgill ............................... 379/10 |
| 5,854,824 | * | 12/1998 | Bengal et al. ....................... 379/34 |
| 5,946,372 | * | 8/1999 | Jones et al. ......................... 379/1 |
| 5,995,588 | * | 11/1999 | Crick ................................... 379/22 |
| 6,125,458 | * | 9/2000 | Devan et al. ....................... 379/14 |
| 6,154,447 | * | 11/2000 | Vedder ................................ 379/26 |

FOREIGN PATENT DOCUMENTS

| 0622937 A2 | 11/1994 | (EP) . |
| WO 97/19544 | 5/1997 | (WO) . |

\* cited by examiner

*Primary Examiner*—Huyen Le
*Assistant Examiner*—Quoc D. Tran
(74) *Attorney, Agent, or Firm*—Nixon & Vanderhye P.C.

(57) ABSTRACT

Circuit faults between different circuits in a telecommunications network are located. In this invention a test signal is generated on a particular circuit and all adjacent circuits are tested for the presence of the test signal. Using information from a routing database the likely location of a circuit-to-circuit fault may be determined.

11 Claims, 7 Drawing Sheets

INTER-CIRCUIT LINE FAULT LOCATION IN TELECOMMUNICATION NETWORKS

BACKGROUND OF THE INVENTION

1. This invention relates to a method for locating circuit to circuit faults in a telecommunications network and also to a fault location system for locating circuit to circuit faults in the terminating circuits of a telecommunications network.

2. Related Art

A conventional public telecommunications network comprises a relatively small number of interconnected main switches and a much larger number of local switches, each of which is connected to one or two main switches. The local switches are connected to the terminating circuits of the network and the far ends of these circuits are connected to terminal equipment such as telephone instruments provided for users of the network. The network formed from the main switches and local switches is known as the core network while a network formed from the terminating circuits is known variously as an access network or a local loop. In this specification, it will be referred to as an access network. Some terminating circuits are connected to a remote concentrator, which may or may not have switching capability. The remote concentrator is then connected to a local switch. In this specification, the term "local switch" is to be interpreted to cover both local switches and remote concentrators.

In a conventional access network, each terminating circuit is formed from a pair of copper wires. Typically, each pair of copper wires passes through a series of nodes between the local switch and terminal equipment. Examples of such nodes are primary cross-connect points, secondary cross-connect points, distribution points and joints.

Unfortunately, terminating circuits are prone to faults. In the case of a terminating circuit carried by a pair of copper wires, example of such faults are disconnection, a short circuit between two wires of a pair of wires and a short circuit between one of the wires and earth. In the case of a conventional access network formed from pairs of wires, the causes of the faults include ingress of water into a node and also physical damage to a node.

Local switches are each provided with a line test apparatus which may be used to test its terminating circuits. Such test systems are useful for detecting and locating faults in individual terminating circuits. However, the present practice suffers from the disadvantage that current line test apparatus are notoriously bad at correctly locating pair-pair faults. Current techniques involve testing only one pair. The measurements on a pair suffering from a circuit to circuit fault can determine that a fault exists, but they cannot give any indication as to the location of the fault within the access network. It is time consuming for an engineer to have to open several nodes before locating and repairing a fault. Furthermore, as the nodes are of a delicate construction, each time an engineer opens a node he may damage the node with the result that there is another fault on a terminating circuit.

SUMMARY OF THE INVENTION

According to one aspect of the present invention there is provided a method of locating a fault in a telecommunications network, said network including a local switch and a set of circuits extending between the local switch and terminating equipment provided for users of the network, each of said terminating circuits passing through a series of nodes between said local switch and its terminating equipment, said method comprising the steps of:
generating a test signal on a particular circuit;
accessing a routing database to determine the identity of all circuits which are adjacent to said particular circuit at any point between the local switch and the terminal equipment associated with said particular circuit;
testing all such adjacent circuits for the presence of said test signal to determine a set of circuits exhibiting the test signal; and
using the set to locate any fault between said particular circuit and another circuit.

Preferably in said step of using the set to locate any fault, a fault is located by determining the furthest point from the local switch where said set of circuits are adjacent to the particular circuit.

The test signal may be a speech band signal and optionally may be a pseudo random binary sequence.

According to another aspect of the present invention, there is provided a fault location system for locating circuit to circuit faults in a telecommunications network including a local switch and a set of terminating circuits extending between the local switch and terminal equipment provided for users of the network, each of said terminating circuits passing through a series of nodes between said local switch and its respective terminal equipment, said fault location apparatus comprising:
signal generating apparatus arranged to send a test signal along an individual terminating circuit;
signal detecting apparatus arranged to detect the presence of said test signal on terminating circuits;
a store containing data relating to the routing of said terminating circuits through said nodes; and
means for controlling said test signal generating apparatus and said test signal detecting apparatus, said control means being arranged to:
instruct said test signal generating apparatus to generate a test signal on a particular circuit;
access said store to determine the identity of all circuits which are adjacent to said particular circuit at any point between the local switch and the terminal equipment associated with said particular circuit;
instruct the test signal generating apparatus to test all such adjacent circuits for the presence of said test signal to determine a set of circuits exhibiting the test signal; and
use the set to locate any fault between said particular circuit and another circuit.

Preferably the fault location system locates faults on terminating circuits from a location remote from the local switch.

Preferably a fault is located by determining the furthest point from the local switch where said set of circuits are adjacent to the particular circuit.

The signal generation apparatus generates a speech band test signal and the test signal may be a pseudo random binary sequence.

In a preferred embodiment the fault location system carries out said tests using common channel signalling.

The fault location system may be an interactive speech applications platform.

This invention provides a new technique which will augment current measurements, to provide additional information for the location of such pair-pair faults.

BRIEF DESCRIPTION OF THE DRAWINGS

This invention will now be described in more detail, by way of example, with reference to the drawings in which.

DETAILED DESCRIPTION OF EXEMPLARY EMBODIMENT

Figure 1:
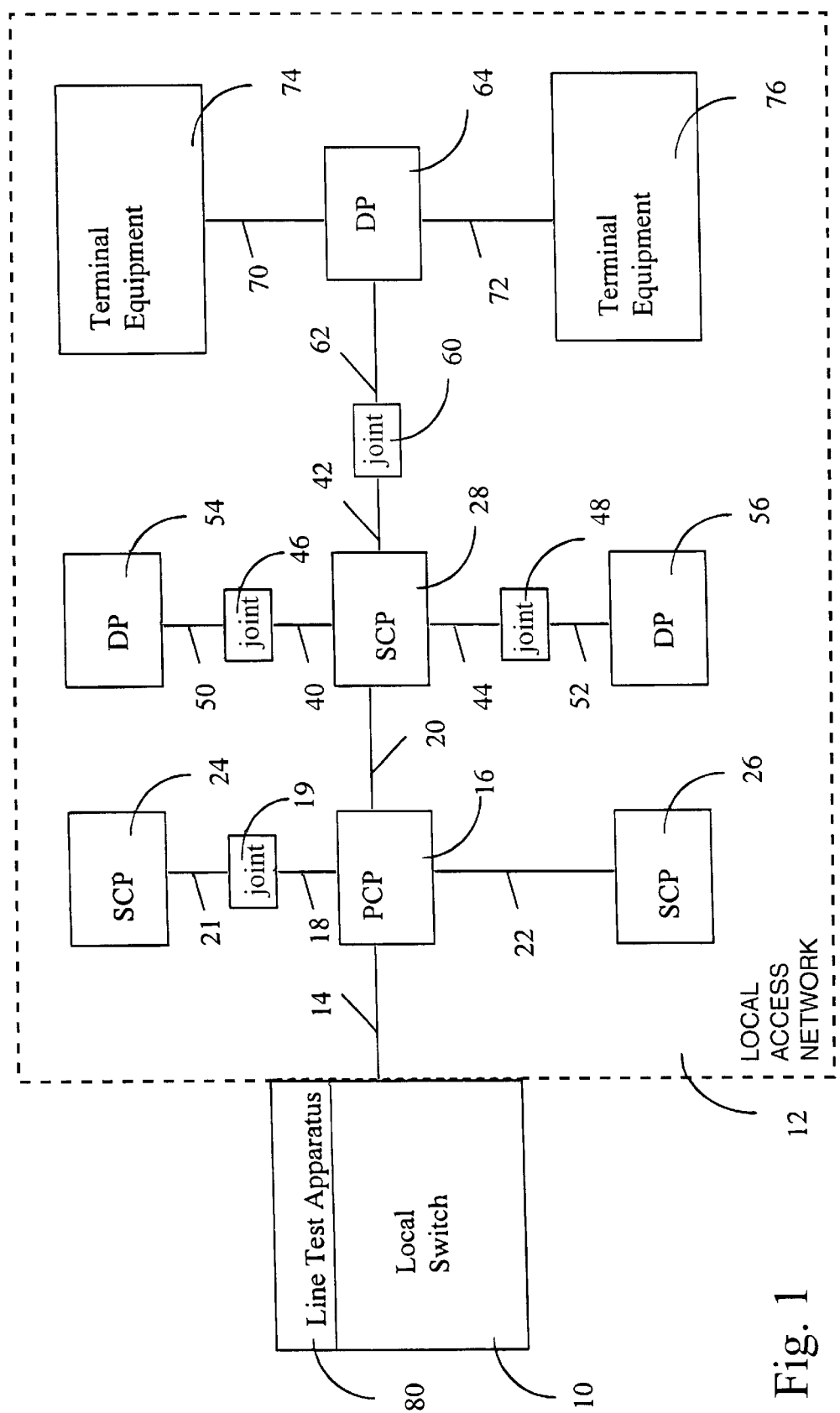
FIG. 1 is a block diagram of an access network and an associated local switch which form part of a telecommunications network in which the present invention may be used.

Referring now to FIG. 1, there is shown a local switch 10 and a conventional access network 12 connected to the local switch 10. The local switch 10 and the access network 12 form part of a public telecommunications network. The local switch 10 is connected to the terminating circuits or lines of the access network 12. Typically, a local switch is connected to several thousand terminating circuits. Each terminating circuit or line passes through several nodes before reaching its respective terminal equipment. These nodes comprise primary cross-connect points, secondary cross-connect points, distribution points and junctions and examples of these nodes will be described below.

In the conventional access network 12 shown in FIG. 1, each terminating circuit or line is formed from a pair of copper wires. The copper wires leave the local switch 10 in the form of one or more cables. One of these cables is shown in FIG. 1 and indicated by reference numeral 14. The far end of cable 14 from switch 10 is connected to a primary cross-connect point 16 which may be housed in a street cabinet or underground junction box. From the primary cross-connect point 16, the terminating lines branch out as cables in several directions. For simplicity, in FIG. 1 there are shown only three cables 18, 20 and 22. The far end of cable 18 is connected to a joint 19. The joint 19 is connected by cable 21 to a secondary cross-connect point 24. The far ends of cables 20 and 22 are connected, respectively, to secondary cross-connect points 26 and 28. For reasons of simplicity, the continuations of the terminating lines beyond secondary cross-connect points 24 and 26 are not shown. The secondary cross-connect points 24, 26 and 28 are housed in junction boxes which may be located above or below ground.

From the secondary cross-connect point 28, the terminating lines branch out again in several directions in the form of cables. By way of illustration, FIG. 1 shows cables 40, 42, and 44 leaving the secondary cross-connect point 28. Cables 40 and 44 are connected, respectively, to joints 46 and 48. Joints 46 and 48 are connected, respectively, to cables 50 and 52, the far ends of which are connected to distribution points 54 and 56.

The far end of cable 42 is connected to a joint 60. The joint 60 is connected by cable 62 to a distribution point 64. For reasons of simplicity, the terminating lines beyond distribution points 54 and 56 are not shown.

Distribution points are implemented as junction boxes which are typically located on telephone poles. From each distribution point, the terminating lines branch out as single copper wire pairs to where terminal equipment provided for a user of the network is located. By way of illustration, FIG. 1 shows two single copper wire pairs 70, 72, leaving the distribution point 64. The far ends of copper wire pairs 70 and 72 are connected, respectively, to terminal equipment 74, 76. As is well known, terminal equipment may take various forms. For example, terminal equipment may be a public telephone located in a public telephone box, a telephone instrument located in a domestic house or an office, or a fax machine or a computer located in a customer's premises.

In the example shown in FIG. 1, each of the joints 19, 46, 48 and 60 is used to connect two cables together. Joints may also be used to connect two or more smaller cables to a larger cable.

The cable 14 is housed in a duct. The air in the cable 14 is kept at a pressure above ambient pressure. This discourages ingress of water to the cable and faults in such cables are uncommon.

In each terminating line, the two wires of each pair are designated as the A wire and the B wire. At the local switch 10, in order to supply current to the line, a bias voltage of approximately 50V is applied between the A wire and the B wire. As the bias voltage was applied in the early exchanges by using a battery, the bias voltage is still known as the battery voltage. In some modern exchanges a voltage limited current source is used. In the terminal equipment, the A wire and B wire are connected by a capacitor, the presence of which may be detected.

The terminating lines in the access network 10 are prone to faults. The main causes of these faults are ingress of water and physical damage to the nodes through which the terminating lines pass between the local switch 10 and terminal equipment, There are five main faults which occur due to causes arising in the nodes. These faults are disconnection, short circuit, faulty battery voltage, earthing fault and low insulation resistance. A disconnection arises where a terminating circuit is interrupted between the local switch and the terminal equipment. A short circuit arises where the A wire and B wire of a circuit are connected together. A faulty battery voltage arises where the A wire or the B wire of a terminating circuit has a short circuit connection to the B wire of another circuit. An earthing fault arises when the A wire or B wire is connected to earth, or to the A wire of another terminating circuit. Low insulation resistance arises where the resistance between the A wire and the B wire or between one of the wires and earth or between one of the wires and a wire of another line is below an acceptable value.

Figure 2:
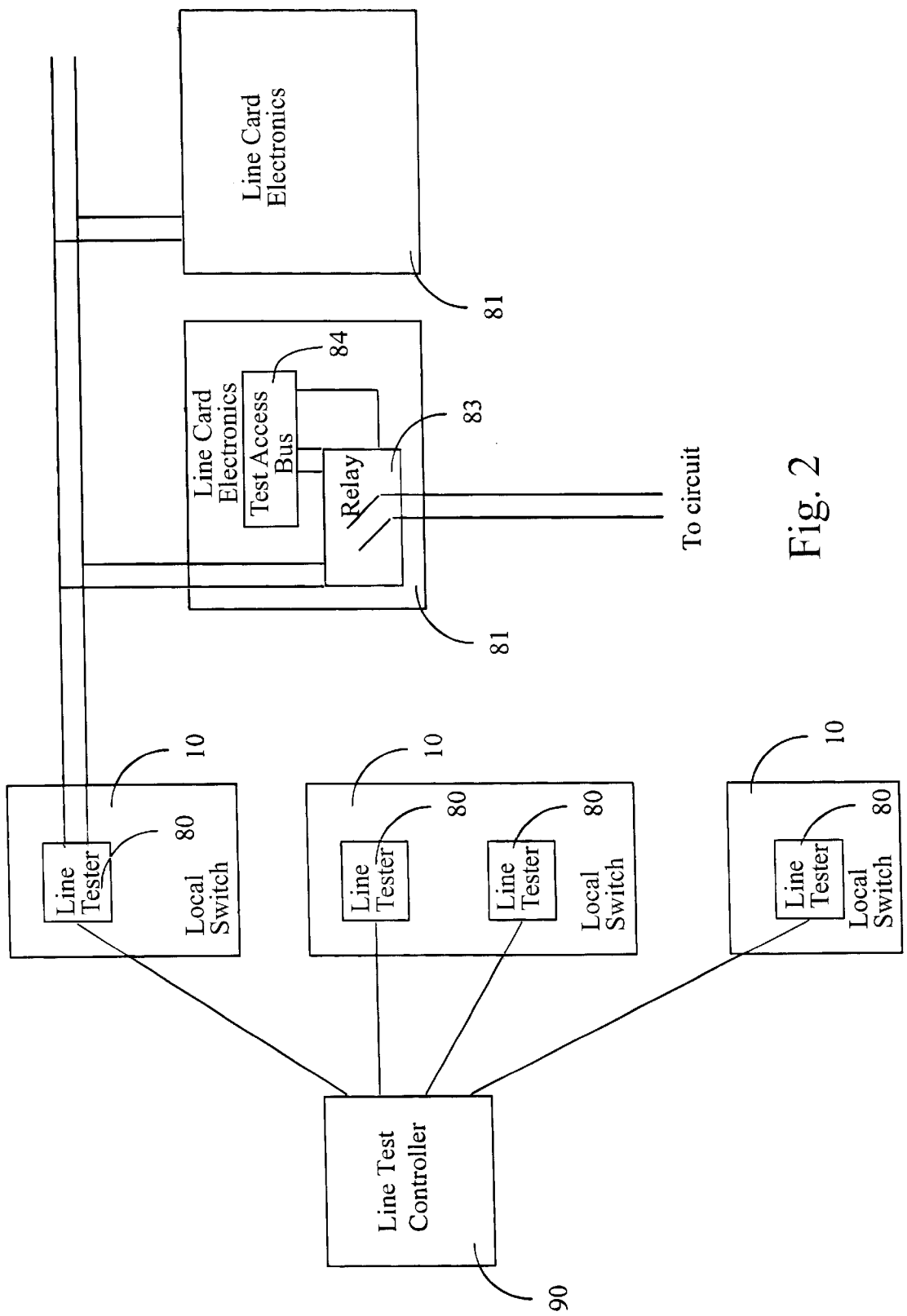
FIG. 2 is a block diagram showing the arrangement of a test controller, test apparatus test apparatus and line cards in a local exchange.

In order to detect faults in the terminating lines of the access network 12, the local switch 10 is provided with a line test apparatus 80. The line test apparatus 80 may be operated from the local switch 10 or from a remote location. FIG. 2 shows several line test apparatus 80 which are controlled by a line test controller 90. Each local switch 10 has one or more line test apparatus 80, each of which is connected via a test access bus 84 to a plurality of line cards 81. Each line card 81 comprises line card electronics 81 and a relay 83. Each circuit may be connected via the relay 83 to either of the test access bus 84 or the line card electronics 82. The line test apparatus 80 is capable of performing various tests, and is useful for detecting and locating faults in individual terminating circuits. However, the line test apparatus 80 tests one circuit at a time, it is not possible for tests to be carried out simultaneously on a pair of circuits which are connected to the same test access bus 84. The measurements on one circuit can determine that a fault between circuits exists, but such measurements do not give any indication as to the location of the fault within the access network.

In conventional line tests, each line in turn is disconnected from the switch 10 and connected to the line test apparatus 80 by means of the relay 83. This requires each local exchange serving circuits to be tested to have a line test apparatus. It is possible to avoid such disconnection, and carry out tests remotely from the local exchange serving the circuits to be tested if tests are carried out using a 'no ring call'. A no ring call facility enables connection to any circuit from anywhere else in the network without the use of ringing (±75V root mean square 25 Hz). Common channel signalling, where the speech and signalling information are transmitted separately, allows the transmission of call related data in addition to basic call progress information. Common channel signalling can support no ring calls, one example of which is the transmission of calling line identification (CLI) information before any ringing is applied to the line.

Figure 3:
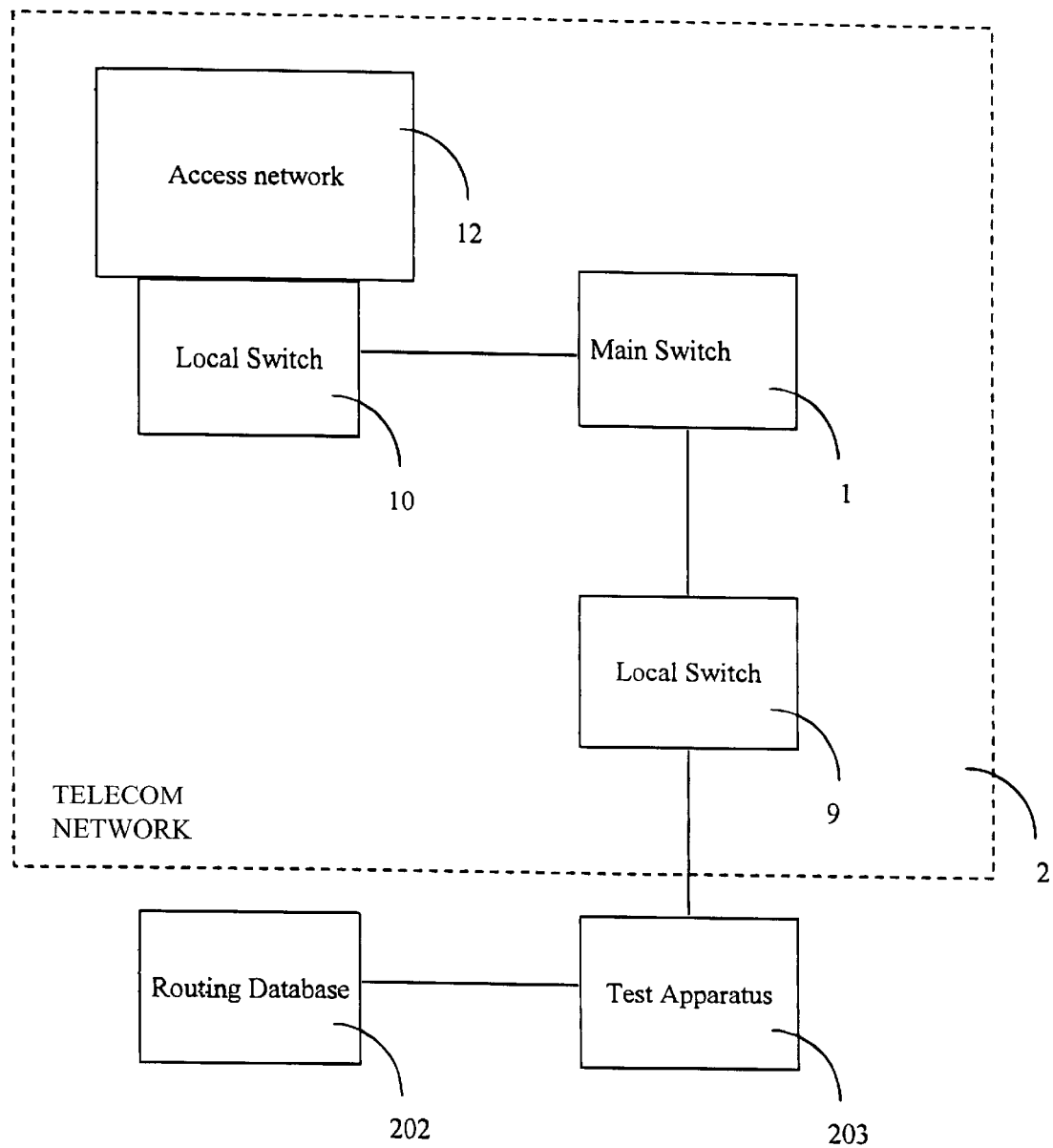
FIG. 3 shows a test apparatus for locating faults between pairs connected to a telecommunications network.

FIG. 3 shows a test apparatus 203 for locating faults between circuits connected to a telecommunications network 2. In the embodiment shown the test apparatus 203 is connected to a local switch 9. The local switch 9 is connected to a main switch 1 which is in turn connected to the local switch 10 serving the local access network 12. The test apparatus 203 may equally well be connected to the local switch 10 serving the local access network 12 containing the circuits to be tested or it may be connected directly to the main switch 1. The access network 12 and switches 1, 9 and 10 form part of a telecommunications network 2. The test apparatus 203 is also connected to a routing database 202, which may be either a centralised routing information database such as BT's Customer Service Systems (CSS) database or may be a local copy of such a database, which may only contain local routing information. The database 202 is implemented as a computer.

Figure 4:
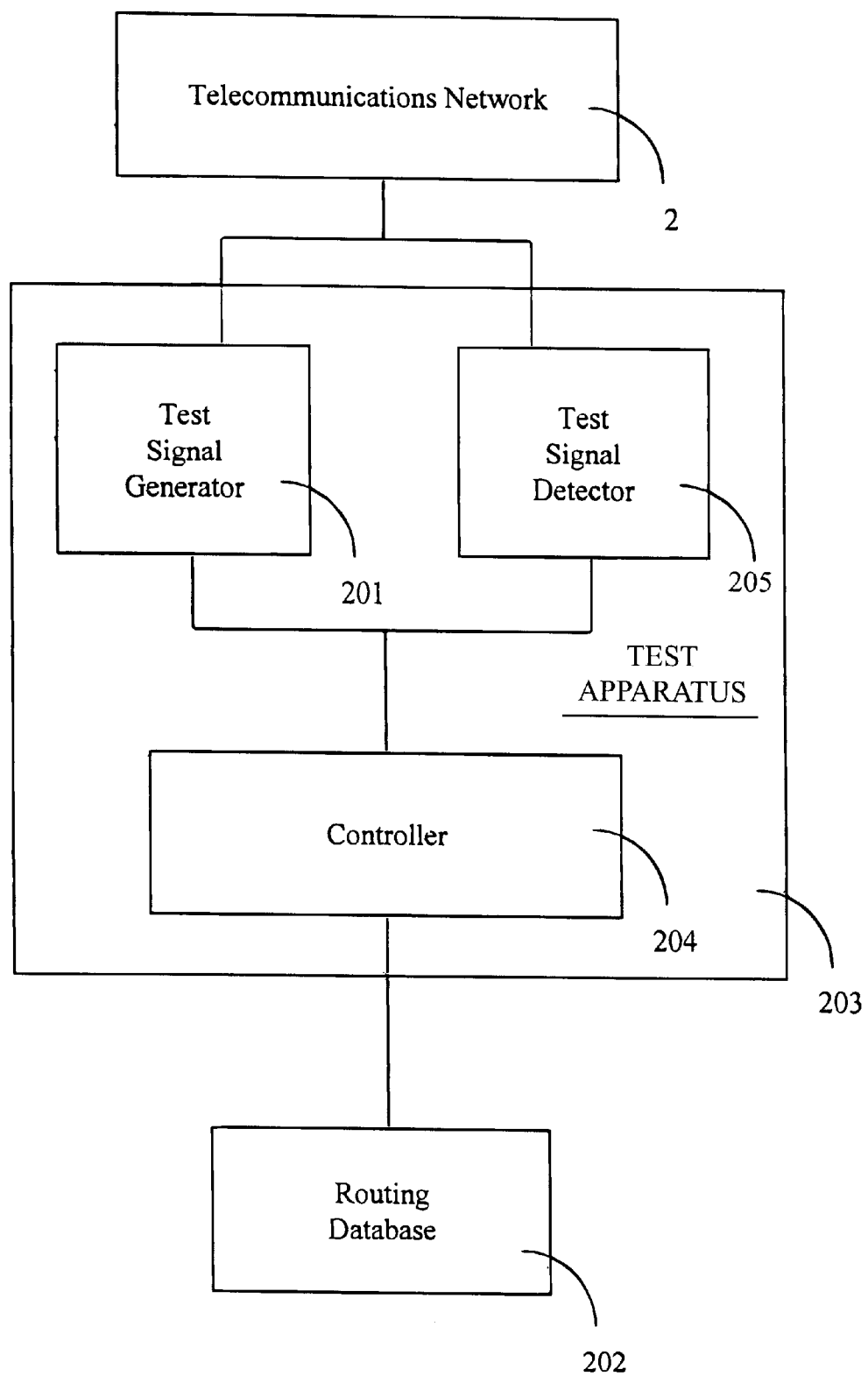
FIG. 4 is a block diagram of the test apparatus of FIG. 3.

Referring to FIG. 4 which shows test apparatus 203 for locating pair-pair faults in the telecommunications network 2. The test apparatus comprises a test signal generator 201, a controller 204 and a test signal detector 205. The test signal generator 201 responds to a request to test a particular terminating circuit by generating a test signal and injecting it into the telecommunications network 12 along the required terminating circuit. The test signal could be any one of the following:

line feed and reverse line feed (40 mA, 50V/−40 mA, −50V),
ringing (±75V root mean square 25 Hz),
CLASS signalling (V23 frequency shift key tones),
line reversal transient,
speech band signal which could, for example, be one of
1 kHz pair identity tone,
dial tone,
multi-frequency tones,
pseudo random binary sequence Other test signals may also be employed.

Ideally the test signal should be different for each test to allow location of faults on different lines simultaneously. If a speech band signal is used, the speech band test signal may be digitally generated and sent along the terminating under test. A pseudo random binary sequence (PRBS) may be used to provide a different signal for each test, and will have the advantage that it will be relatively immune from other spurious signals in the network such as noise.

The routing information for the particular terminating circuit under test is retrieved from the routing database 202. The controller 204 uses the routing information to determine which terminating circuits are adjacent to the circuit under test. An example might be whichever terminating circuits share a node or a cable with the circuit under test. The test signal detector 205 is instructed to detect signals on the required set of terminating circuits. The test signal detector 205 will detect signals using a technique which is compatible with the signal generated by the test signal generator 201. For example, if the signal is a speech band signal, then a line card coder/decoder (CODEC) could be used as the test signal detector. The set of terminating circuits which exhibit the test signal is then used to locate the position of any fault between the circuit under test and another circuit.

Figure 5:
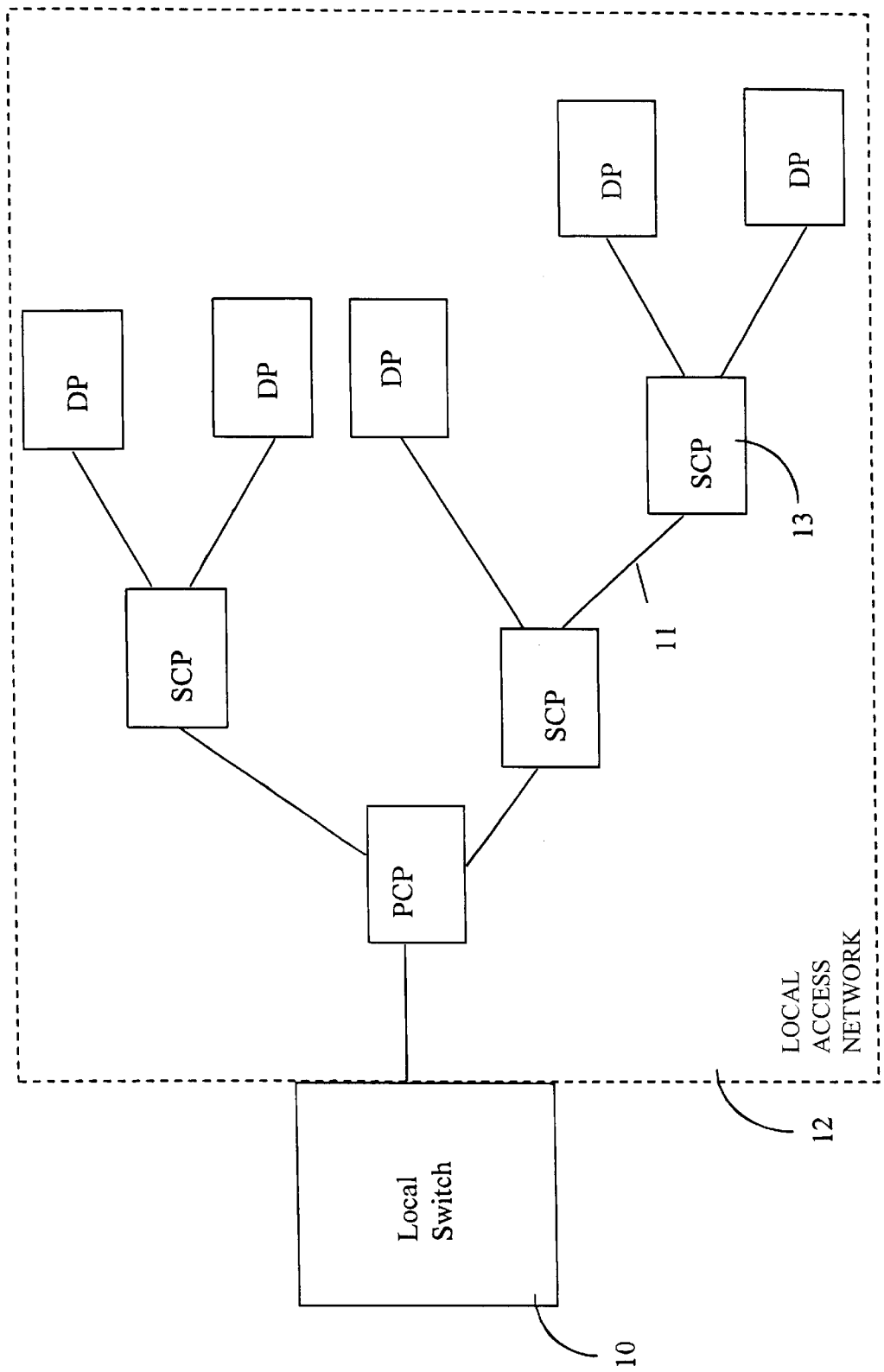
FIG. 5 shows the effect of a fault between two pairs occurring at a particular node in a telecommunications network.

Referring to FIG. 5, if all the circuits on which the test signal is detected are in the cable 11 then the fault is likely to be at SCP 13 or on the exchange side of SCP 13.

Figure 6:
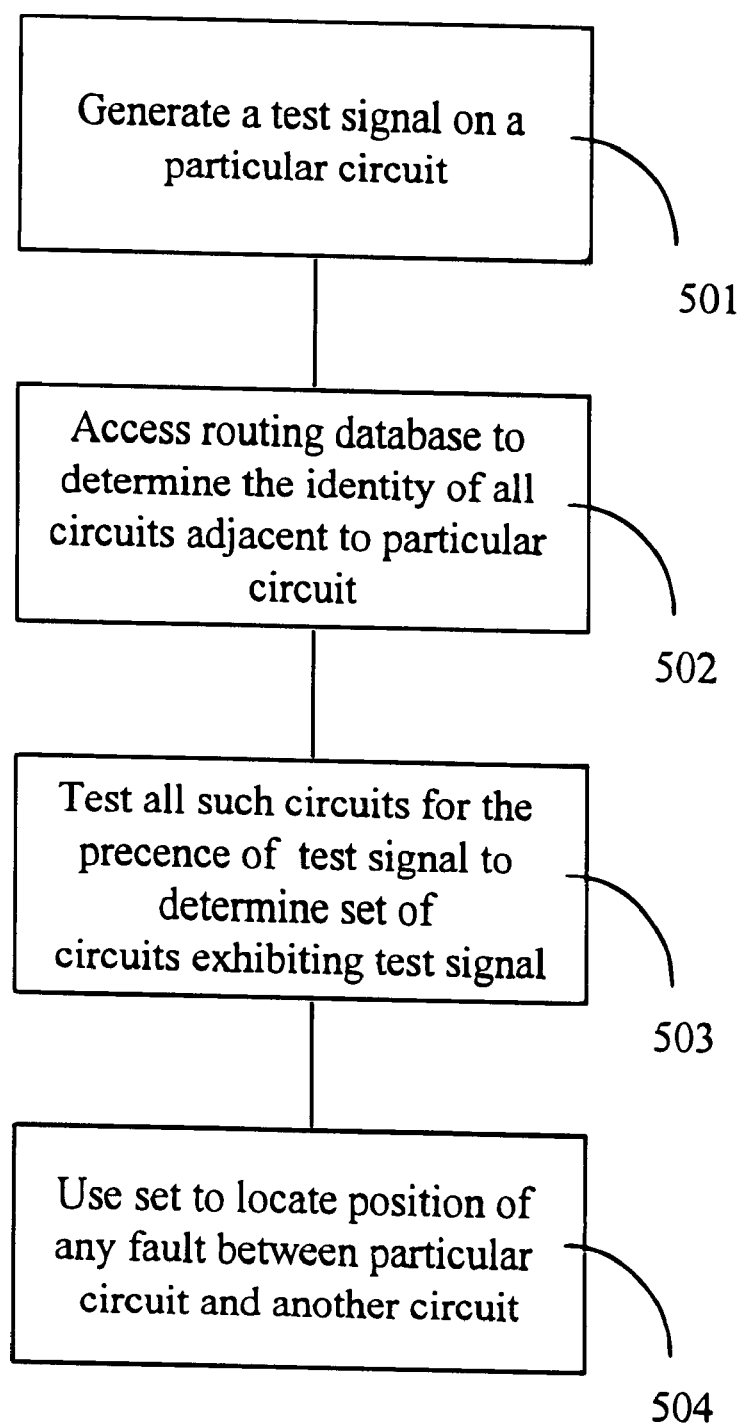
FIG. 6 is a flow chart of a method of locating a pair-pair fault in a telecommunications network.

FIG. 6 shows a flow chart of the operations which are performed by the test apparatus 203 to locate a pair-pair fault in an access network forming part of the telecommunications network 2 and these operations will now be described. Initially, in a step 501 the test apparatus 203 generates a test signal on a particular circuit. Such a test may be the result of a customer fault report, or it may be a routine test carried out on a nightly or weekly basis, for example. In the next step 502, the controller 204 accesses the routing database 202 to determine the identity of all circuits adjacent to the particular circuit at any point between the local switch 10 and the terminal equipment associated with the particular circuit under test. Such circuits may be all circuits which share a cable or a node with the circuit under test. Then in step 503 all such adjacent circuits are tested for the presence of the test signal to determine a set of circuits exhibiting the test signal. Once such a set has been determined in the final step 504 the set is used to locate the position of any fault between the particular circuit and another circuit. For example, the furthest point from the local exchange where the set of circuits are adjacent to each other may give a limit to the distance from the local exchange where a fault lies.

Figure 7:
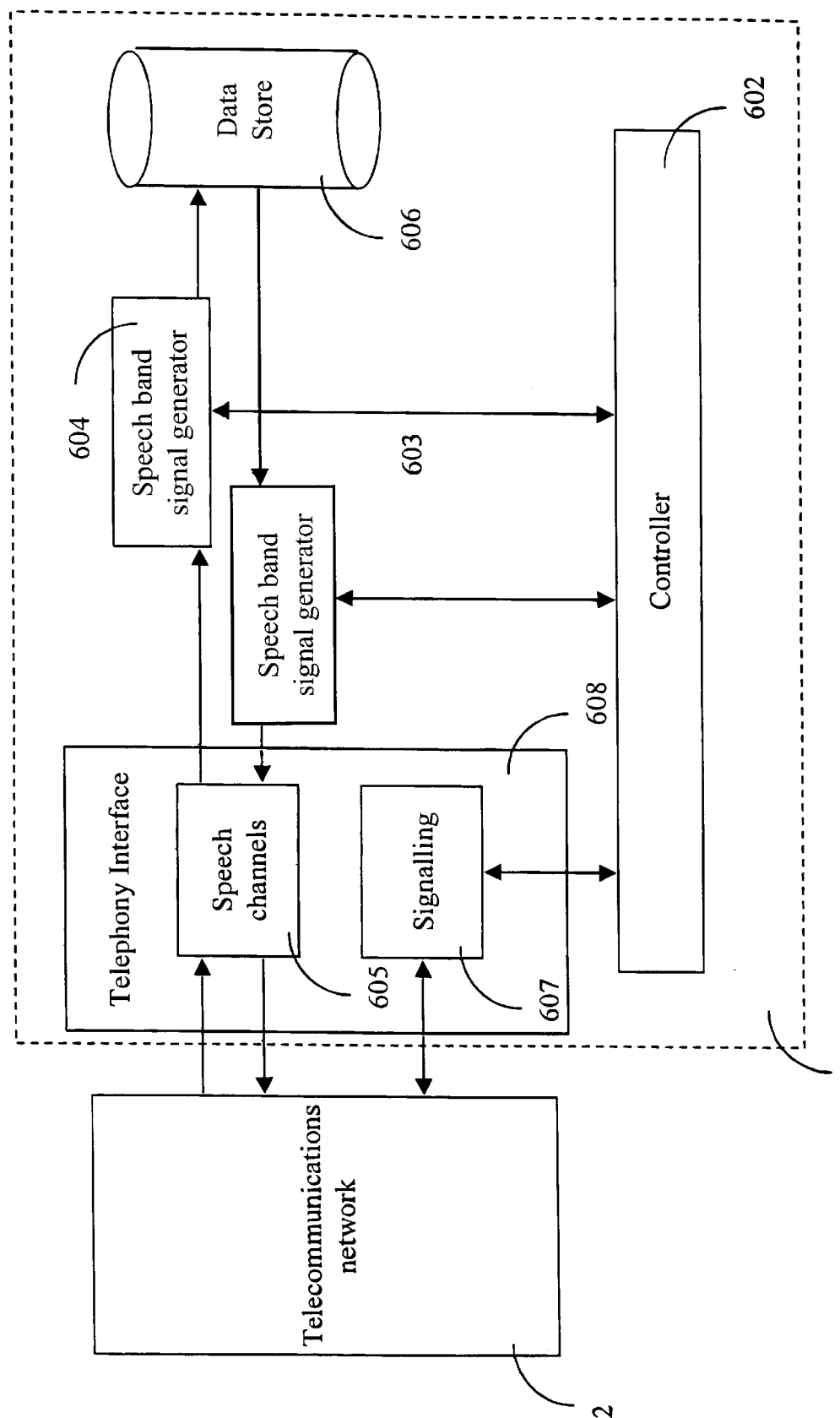
FIG. 7 is a simplified functional block diagram of the Ericsson interactive speech applications platform (ISAP).

The test apparatus 203 may be implemented by using a speech applications platform such as the Ericsson Interactive Speech Applications Platform (ISAP). FIG. 7 shows a simplified functional block diagram of the Ericsson ISAP 601 connected to a telecommunications network 2. A controller 602 is configured to control speech band signal generator 603 and speech band signal detector 604. A telephony interface 608 provides an interface to speech channels 605 and a signalling channel 607. The signalling channel 607 supports ITU-T common channel signalling system number 7 (C7) signalling, and may be instructed to set up no ring calls to any line termination equipment connected to the telecommunications network 2. A data store 606 is used to store speech band signals prior to transmission along speech channels 605, and on receipt via the detection means 604. The controller 602 may be arranged to control the speech band signal detector 604, the speech band generator 603 and the signalling means 607 to carry out the operations described with reference to FIG. 6.

What is claimed is:

1. A method of locating a fault in a telecommunications network, said network including a local switch and a set of terminating circuits extending between the local switch and terminating equipment provided for users of the network, each of said terminating circuits passing through a series of nodes between said local switch and its terminating equipment, said method comprising the steps of:

generating a test signal on a particular circuit;

accessing a routing database to determine the identity of all circuits which are adjacent to said particular circuit at any point between the local switch and the terminating equipment associated with said particular circuit;

testing all such adjacent circuits for the presence of said test signal to determine a set of circuits exhibiting the test signal; and using the set to locate any fault between said particular circuit and another circuit.

2. A method according to claim 1 in which in said step of using the set to locate any fault, a fault is located by determining the furthest point from the local switch where said set of circuits are adjacent to the particular circuit.

3. A method according to claim 1 in which the test signal is a speech band signal.

4. A method according to claim 1 in which the test signal is a pseudo random binary sequence.

5. A fault location system for locating circuit to circuit faults in a telecommunications network including a local switch and a set of terminating circuits extending between the local switch and terminal equipment provided for users of the network, each of said terminating circuits passing through a series of nodes between said local switch and its respective terminal equipment, said fault location apparatus comprising:

signal generating apparatus arranged to send a test signal along an individual terminating circuit;

signal detecting apparatus arranged to detect the presence of said test signal on terminating circuits;

a store containing data relating to the routing of said terminating circuits through said nodes; and means for controlling said test signal generating apparatus and said test signal detecting apparatus, said control means being arranged to:

instruct said test signal generating apparatus to generate a test signal on a particular circuit;

access said store to determine the identity of all circuits which are adjacent to said particular circuit at any point between the local switch and the terminal equipment associated with said particular circuit;

instruct the test signal generating apparatus to test all such adjacent circuits for the presence of said test signal to determine a set of circuits exhibiting the test signal; and use the set to locate any fault between said particular circuit and another circuit.

6. A fault location system according to claim 5 in which the fault location system locates faults on terminating circuits from a location remote from the local switch.

7. A fault location system according to claim 5 in which a fault is located by determining the furthest point from the local switch where said set of circuits are adjacent to the particular circuit.

8. A fault location system according to claim 5 in which the signal generating apparatus generates a speech band test signal.

9. A fault location system according to claim 5 in which the test signal is a pseudo random binary sequence.

10. A fault location system according to claim 5 in which the test signal generating apparatus generates a test signal on a particular circuit using common channel signalling.

11. A fault location system according to claim 5 in which the fault location system is an interactive speech applications platform.

* * * * *